(12) United States Patent
Begley et al.

(10) Patent No.: US 7,371,906 B2
(45) Date of Patent: May 13, 2008

(54) PROCESS FOR PHOTO-OXIDATIVE STABILITY IMPROVEMENTS

(75) Inventors: William J. Begley, Webster, NY (US); William F. Nichols, Newark, NY (US); Manju Rajeswaran, Fairport, NY (US); Natasha Andrievsky, Webster, NY (US); Michael R. Landry, Wolcott, NY (US)

(73) Assignee: Eastman Kodak Company, Rochester, NY (US)

( * ) Notice: Subject to any disclaimer, the term of this patent is extended or adjusted under 35 U.S.C. 154(b) by 676 days.

(21) Appl. No.: 10/924,637

(22) Filed: Aug. 24, 2004

(65) Prior Publication Data

US 2006/0047174 A1    Mar. 2, 2006

(51) Int. Cl.
*C07C 7/20* (2006.01)
*C07C 13/00* (2006.01)

(52) U.S. Cl. ............... 585/2; 585/3; 585/4; 585/5; 585/25; 585/26; 585/27

(58) Field of Classification Search .......... 585/1–5, 585/24–27
See application file for complete search history.

(56) References Cited

U.S. PATENT DOCUMENTS

| | | | | |
|---|---|---|---|---|
| 4,855,520 A | * | 8/1989 | Essenfeld | ............ 585/409 |
| 4,857,168 A | * | 8/1989 | Kubo et al. | ............ 208/58 |
| 6,124,340 A | | 9/2000 | Horvath | |
| 6,140,321 A | | 10/2000 | Imai et al. | |
| 6,387,925 B1 | | 5/2002 | Quallich et al. | |
| 6,756,381 B2 | | 6/2004 | Redkar et al. | |
| 7,049,012 B2 | * | 5/2006 | Begley et al. | ............ 428/690 |
| 7,052,785 B2 | * | 5/2006 | Begley et al. | ............ 428/690 |
| 7,083,865 B2 | * | 8/2006 | Begley et al. | ............ 428/690 |
| 7,087,320 B2 | * | 8/2006 | Begley et al. | ............ 428/690 |
| 7,252,893 B2 | * | 8/2007 | Ricks et al. | ............ 428/690 |

FOREIGN PATENT DOCUMENTS

| | | |
|---|---|---|
| WO | 01/07404 | 2/2001 |
| WO | 01/015700 | 3/2001 |
| WO | 03/026571 | 4/2003 |

* cited by examiner

*Primary Examiner*—Ellen McAvoy
(74) *Attorney, Agent, or Firm*—Arthur E. Kluegel

(57) ABSTRACT

A process for improving the stability to photo-oxidation of a polycyclic aromatic compound having at least two polymorphic forms comprises treating a first polymorph with one or more solvents to obtain the more stable second polymorph and then separating the second polymorph from the solvent.

49 Claims, No Drawings

PROCESS FOR PHOTO-OXIDATIVE STABILITY IMPROVEMENTS

FIELD OF THE INVENTION

This invention relates to a process of forming a polymorph that exhibits improved photo-oxidation stability over the photo-oxidation stability of the other polymorphs of said material, and process steps related thereto.

BACKGROUND OF THE INVENTION

Organic electroluminescent (EL) devices have been known for over two decades. The stability and performance of the materials used in the devices are limitations that represent barriers to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs.

The organic layers in these devices are usually composed of a polycyclic aromatic hydrocarbon. Substituted naphthacenes are one class of fluorescent polycyclic aromatic hydrocarbons useful in the manufacture of EL devices. The naphthacene known as rubrene, or 5,6,11,12-tetraphenyl-naphthacene, is commercially available and can be prepared by reacting 1,1,3-triphenylpropargyl alcohol with thionyl chloride and heating the resulting product in the presence of an organic hindered amine base. Naphthacenes prepared in this manner, must be subjected to extensive purification techniques such as column chromatography, re-crystallization and sublimation to render them free of impurities and of sufficient purity to be useful in EL devices. During the preparation and purification, the materials are exposed to the atmosphere and visible light. Rubrene and other naphthacenes are known to undergo a photo-oxidation reaction in both solution and in the solid state to give endoperoxides as described in for example, Dufraise et. al., Compt.Rend. (1926), 183, 101-105; Z. Physik. Chem (1927), 130, 472-479, Hochstrasser et. al., Trans. Faraday Soc., (1956), 52, 1363-1373, and Santamaria, Tetrahedron Letters (1981), 22(45), 4511-14.

Photo-oxidation is the process wherein a material reacts with atmospheric oxygen in the presence of light to give, in the case of naphthacenes, endoperoxides. The endoperoxides that contaminate rubrene or other naphthacene derivatives give rise to EL devices with unacceptable performance. Even very small amounts of endoperoxides, such as 1% or less, can cause significant problems in these EL devices. Because these naphthacene materials are very prone to photo-oxidation, precautions must be taken to eliminate the formation of the endoperoxides when the naphthacenes are being prepared, purified and stored. During the naphthacene preparation previously described, significant reduction in the formation of endoperoxides can easily be achieved by performing the reaction and purification in the dark or under subdued lighting, or under an inert atmosphere such as nitrogen, or preferably under both reduced lighting and inert atmosphere conditions. In addition, storage of the materials is another concern. Although the materials can be stored and sold in light tight containers free from both oxygen and light, once the container has left the manufacturer and is opened, the material will be exposed to the conditions that cause and accelerate the formation of the endoperoxides.

A solution to the storage of these materials would be to convert the materials into a form that would be less prone to photo-oxidation. Polymorphism is a phenomenon that some materials exhibit, allowing them to exist in different forms, often referred to as polymorphs, and which potentially can have different chemical and physical properties in the solid state. Polymorphism is well known in the pharmaceutical industry where the differences in the properties of polymorphs are utilized to increase the stability of drugs towards heat and humidity. Ideally, conversion of the polycyclic aromatic compound from a photo-oxidative unstable polymorph to a photo-oxidative stable polymorph would solve the storage problem of such materials.

Redkar et. al., U.S. Pat. No. 6,756,381; Quallich et. al., in U.S. Pat. No. 6,387,925; Imai et. al., in U.S. Pat. No. 6,140,321; and Horvath in U.S. Pat. No. 6,124,340 describe specific examples and applications of polymorphism in the pharmaceutical industry.

Redkar et. al., in U.S. Pat. No. 6,756,381 describes a preparation for polymorphic forms of 9-nitrocamptothecin (9NC). Distinct crystal forms of 9NC are obtained by crystallizing it from different solvent systems and under various conditions, and are further characterized using various analytical methods. For example, a particular crystal form of 9NC is provided which is characterizable as having, by differential scanning calorimetry, an endotherm at between 175.5° C. and 177.2° C., and an exotherm at between 181.7° C. and 183.7° C. Various polymorphs of 9NC were prepared and their solubility was studied in different solvents.

Quallich et. al., in U.S. Pat. No. 6,387,925 describes the two crystalline polymorphic Forms A and B of (2-benzhydryl-1-azo-bicyclo[2.2.2]oct-3-yl)-(5-isopropyl-2-methoxybenzyl)amine citrate monohydrate. The pharmaceutical composition containing at least 1 of these polymorphs has advantageous stability for formulation to treat acute emesis in patients receiving chemotherapy. Citric acid was added to the free base of said compound in iso-propanol and the mixture was stirred until crystallization started. Filtration and granulation gave the anhydrous citrate salt (Form A). This Form A was dissolved in methanol and the solution concentrated to give Form B. Form A of the citrate salt is hygroscopically stable which is advantageous in overcoming pharmaceutical formulations problems due to weight changes. Form B exhibits similar properties but not as pronounced.

Imai et. al., in U.S. Pat. No. 6,140,321 describes four polymorphs of the drug donepezil-HCl for pharmaceutical uses, which are stable against heat and humidity when compared to the previously known form. They are prepared by dissolving the free base in ethanol followed by treatment with diisopropyl ether. The four polymorphs are formed by varying the time before filtration, and are characterized by peaks in their x-ray powder diffraction patterns, and absorption peaks in their infrared absorption spectra.

Horvath in U.S. Pat. No. 6,124,340 describes an invention related to a novel form of the HMG-CoA reductase inhibitor fluvastatin, more specifically to a highly crystalline form of sodium fluvastatin, referred to as sodium fluvastatin Form B. The previous form of sodium fluvastatin was very susceptible to degradation below pH 8 and also showed sensitivity to heat and light. Horvath describes several methods for preparing sodium fluvastatin Form B, which has been found to exhibit reduced degradation below pH 8 and also, improved sensitivity towards heat and light.

There is no indication in the art that polycyclic aromatic compounds can be converted to polymorphic forms that are more stable to photo-oxidation for use in the long-term storage of these materials.

The device stability and luminance performance of polycyclic aromatic compounds in EL devices in general, tends to improve when fabricated from materials with high purity and free of endoperoxides. There is a continuing need in the EL industry for new procedures for the preparation of high purity polycyclic aromatic hydrocarbons but in particular naphthacene compounds which can be stored for prolonged periods of time with little or no photo-oxidation. Devices fabricated from naphthacenes with small amounts of endoperoxides give poor performing EL devices and limit the applications of these EL devices.

The problem to be solved therefore is to provide a simple process that would significantly reduce or eliminate the propensity of polycyclic aromatic compounds to undergo photo-oxidation. Such a process should yield polycyclic aromatic hydrocarbons more robust in their exposure to light and oxygen under storage conditions, significantly reducing the formation of endoperoxides, and thus leading to EL devices that give satisfactory performance.

SUMMARY OF THE INVENTION

The invention provides a process for improving the stability to photo-oxidation of a polycyclic aromatic compound where the compound exists in at least two polymorphic forms where the first polymorph, corresponding to that which would be formed upon sublimation, is relatively unstable to photo-oxidation compared to the second form, comprising treating the first polymorph with one or more solvents to obtain the more stable second polymorph of the polycyclic aromatic compound and then separating the second polymorph from the solvent.

The process provides a simple and rapid way to significantly reduce the propensity of polycyclic aromatic compounds to undergo photo-oxidation. Such a process provides for polycyclic aromatic hydrocarbons to be more robust in their exposure to light and oxygen under storage conditions, significantly reducing the formation of endoperoxides and thus leading to EL devices that give satisfactory performance.

DETAILED DESCRIPTION OF THE INVENTION

The process of the invention is generally as described above. It is a process for converting a polycyclic aromatic compound useful in EL devices, which has been sublimed as part of the purification procedure, from a photo-oxidatively unstable polymorph into a photo-oxidatively stable second polymorph by treating the unstable polymorph with one or more solvents. After the more stable polymorph has been formed it is separated from the solvent, preferably by filtration or other suitable techniques known to those skilled in the art, and the residual solvent removed by drying under vacuum, preferably at elevated temperatures, if such conditions are needed. Alternatively, before drying under vacuum the second polymorph can be treated a second time or even additional times with a solvent or mixture of solvents separating the stable polymorph from the solvent each time. The final step can be the drying process under vacuum and elevated temperature, if such conditions are needed. Such polymorphs are stable or are significantly improved in their stability towards photo-oxidation, and are useful in the long-term storage of said polycyclic aromatic materials in the EL industry.

Polymorphism is the ability of a material to exist in two or more different forms, which are referred to as polymorphs; see *Grant & Hackh's Chemical Dictionary*, 5th Edition, Roger Grant and Claire Grant, McGraw-Hill Book Company, page 463. Because the polymorphs of a material have different crystal packing they can exhibit different physical and chemical properties in their solid crystalline states. This means that the polymorphs of a particular material, while in the solid phase, may have the potential to exhibit different rates of reactivity towards chemical reagents.

Polycyclic aromatic compounds encompass both polycylic aromatic hydrocarbons and heteroatomic polycyclic aromatic hydrocarbons. These materials and their substituted derivatives consist of two or more fused aromatic rings. They can be carbocyclic or heterocyclic in nature. The aromatic rings may be fused in a linear fashion as in a straight line, such as that found in anthracene, azulene, biphenylene, fluorene, hexacene, s-indacene, indene, naphthalene, naphthacene, octalene, pentacene, pentalene, and derivatives thereof formed by the fusion of other rings; or they may be fused in a non-linear fashion, such as that found in aceanthrylene, acenaphthalene, acephenanthrylene, 3,4-benzopyrene, chrysene, coronene, fluoranthene, hexahelicene, as-indacene, ovalene, pentahelicene, pentaphene, perylene, phenanthrene, phenalene, picene, pleiadene, pyranthrene, pyrene, rubicene, tetraphenylene, triphenylene, trinaphthylene, and derivatives thereof formed by the fusion of other rings. It should be realized that the process of the present invention is not limited to the polycyclic aromatic compounds in the aforementioned list but it may also be applied to any polycyclic aromatic compound which forms an unstable polymorph upon sublimation and a stable polymorph on treating with one or more solvents. A particularly useful group of materials belonging to the polycyclic aromatic hydrocarbon class and useful in the present invention is those based on the naphthacene structure and its derivatives.

Treating the sublimed first polymorph of the polycyclic aromatic compound with one or more solvents may be a homogeneous or heterogeneous process, or it may be a simple slurrying process. When it is homogeneous it means that the first polymorph dissolves in the solvent or mixture of solvents and crystallizes back out from the solution as the more stable second polymorph. When it is heterogeneous it means that the conversion of the first polymorph into the second more stable polymorph occurs in a two-phase system without dissolution of the first polymorph. Both the homogeneous and the heterogeneous processes or the slurrying process may proceed by use of a single solvent or by a mixture of two or more solvents. It should be noted that the term "solvent" is being used in the context of both the homogeneous and heterogeneous processes. In the heterogeneous process, even though the solvent is not dissolving the first polymorph and hence not acting as a solvent per se in the true sense of its meaning, it is however convenient to refer to it as a solvent for simplicity. In this sense, it has the potential of acting as a solvent.

Solvents useful in the invention can be selected from those that fall under the classifications of alcohol, amine, amide, carboxylic acid, ether, ester, hydrocarbon, ketone, sulfone, sulfoxide, sulfide, disulfide, and nitrile containing solvents. The invention is not limited to these solvent classifications but can also be selected from solvent classes familiar to those skilled in the art. Of these solvents, solvents that contain from 1 to 12 carbon atoms are useful. Particularly useful solvents can be selected from mono-ethers, polyethers, aliphatic, aromatic, and hetero-aromatic hydrocarbons, halogenated solvents such as fluoro, chloro, bromo and iodo containing hydrocarbons, and nitro hydrocarbon solvents. Specific solvents can be selected from acetic acid, acetone, acetonitrile, aminoethane, benzene, bromoethane, bromoethylene, n-butanol, i-butanol, t-butanol, carbon disulfide, carbon tetrachloride, chlorobenzene, chloroethane, chloroethylene, chloroform, cyclohexane, cyclohexanol, 1,2-dibromoethane, dibromomethane, o-dichlorobenzene, 1,1-dichloroethane, 1,2-dichloroethane, dichloromethane, 1,2-diethoxyethane, diethylamine, diethylene glycol, diethyleneglycol diethyl ether, diethylene glycol dimethyl ether (diglyme), diethyl ether, diiodoethane, 1,1-dimethoxyethane, 1,2-dimethoxyethane, N,N-dimethylacetamide, 2,2-dimethylbutane, 2,3-dimethylbutane, N,N-dimethylforamide, N,N-dimethylpropionamide, dimethylsulfoxide, 1,2-diiodoethane, 1,4-dioxane, ethanol, ethanolamine, ethyl acetate, ethylamine, ethylbenezene, ethylene glycol, ethylene glycol dimethyl ether (glyme), ethyl formate, ethyl methyl ketone, formamide, formic acid, heptane, hexane, isooctane, mesitylene, methanol, methyl acetate, nitrobenzene, nitromethane, octane, pentane, i-propanol, n-propanol, propionitrile, pyridine, sulfolane, 1,1,2,2-tetrachloroethane, tetrachloroethylene, tetrahydrofuran, toluene, triethylamine, triethylene glycol dimethyl ether (triglyme), 2,2,2-trifluoroethanol, water, o-xylene, m-xylene and p-xylene. More specifically the solvents can be selected from the more common solvent of acetic acetone, acetonitrile, benzene, n-butanol, i-butanol, t-butanol, carbon disulfide, carbon tetrachloride, chloroform, cyclohexane, dichloromethane, diethyl ether, N,N-dimethylforamide, dimethylsulfoxide, 1,4-dioxane, ethanol, ethyl acetate, ethyl methyl ketone, heptane, hexane, methanol, i-propanol, n-propanol, tetrahydrofuran, toluene, water, o-xylene, m-xylene and p-xylene.

The temperature of the process can be a temperature in the range over which the solvent or the solvent mixture is a liquid. Conveniently the temperature can be from 0° C. to the boiling point of the solvent or the solvent mixture. But most conveniently the temperature can fall in the range from 20° C. to 50° C. The temperature that is employed in the process is the temperature that is required to bring about the conversion of the unstable first polymorph after sublimation to the stable second polymorph.

When the polycyclic aromatic compound of the invention belongs to the naphthacene class it can be represented by formula (I):

Formula (I)

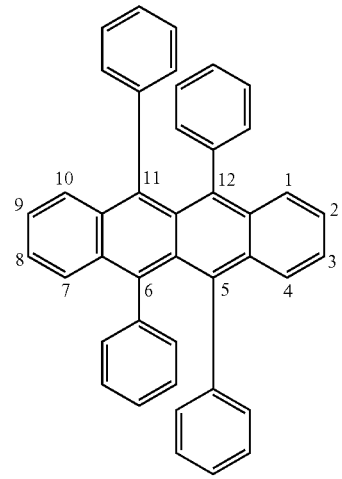

wherein:
a) any hydrogen can be substituted;
b) there are identical substituent groups at the 2, 3, 8 and 9-positions; and
c) provided that no more than 4 substituents are tertiary butyl groups.

A preferred group of naphthacene compounds of formula (I) are those in which there are only two substituents present on the end rings of formula (I) and wherein:
a) there are identical substituent groups at the 2- and 8-positions;
b) the phenyl rings in the 5- and 11-positions contain only para-substituents identical to the substituent groups in paragraph a); and
c) provided that when the substituent groups are tertiary butyl groups, there are no more than 4 of said groups present.

A more preferred group of naphthacene compounds of formula (I) are those in which the two substituents present on the end rings of formula (I) are selected from alkyl and carbocyclic groups and wherein:
a) there are identical alkyl or carbocyclic groups at the 2- and 8-positions;
b) the phenyl rings in the 5- and 11-positions contain only para-substituents identical to the alkyl or carbocyclic groups in paragraph a); and
c) provided that there are no more than 4 tertiary butyl groups present.

Particularly useful alkyl groups are branched alkyl groups and particularly useful carbocyclic groups are non-aromatic carbocyclic groups. The phenyl rings in the 6- and 12-positions in formula (I) may or may not be substituted. When the phenyl rings in the 6- and 12-positions in formula (I) are substituted useful compounds for the process of the invention are represented by formula (II):

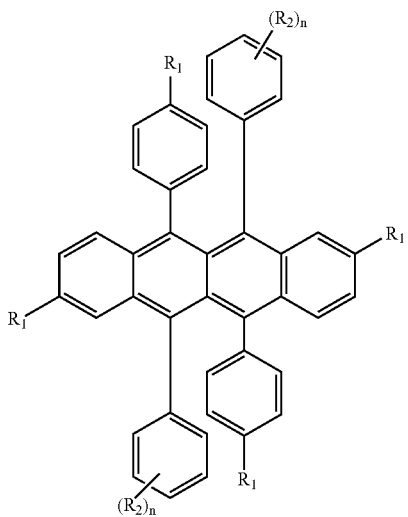

Formula (II)

wherein
R$_1$ is represented by the formula:

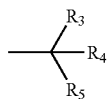

wherein each of R$_3$, R$_4$ and R$_5$ is hydrogen or an independently selected substituent or R$_3$, R$_4$ and R$_5$ taken together can form a mono- or multi-cyclic ring system;
R$_2$ is a substituent group;
n is 1-5;
provided that all R$_1$ groups are the same; and
provided further, that the R$_2$ groups, their location and n value on one ring are the same as those on the second ring; and
provided still further, that no more than 4 substituents are tertiary butyl groups.

It is believed that the behavioral difference between the first and second polymorph can be attributed to the molecular interlayer distance in the crystal, i.e. the distance between the layers of molecules in the crystal. X-ray crystal diffraction experiments show that the interlayer distance in the stable polymorph is in the region of 5 angstroms whereas that in the unstable form is in the region of 7.1 angstroms. (An angstrom is a small unit of distance used by those skilled in x-ray diffraction and is equal to $10^{-7}$ mm or $10^{-10}$ m). It is believed that when the molecular layers in the crystal are close together, as in the stable polymorph, oxygen is unable to effectively penetrate the crystal lattice to get to the site where the photo-oxidation reaction occurs. Conversely, when the molecular layers in the crystal are far apart, as in the unstable polymorph, oxygen can easily penetrate the crystal lattice and is readily available at the site where the photo-oxidation reaction takes place. Preferred polymorphs of the invention thus have molecular interlayer distances of less than 7 angstroms. Another way of considering this is that the unstable polymorph has a lower density than the stable second polymorph.

Unless otherwise specifically stated, when a substituent group contains a substitutable hydrogen, it is also intended to encompass not only the substituent's unsubstituted form, but also its form further substituted with any substituent group or groups as herein mentioned, so long as the substituent does not destroy properties necessary for the invention. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy) ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentylphenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecyl amino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl) carbonylamino, p-dodecyl-phenylcarbonylamino, p-tolylcarbonyl amino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbanoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

EXAMPLE 1

The invention is further exemplified in the following scheme to prepare the first relatively unstable polymorph, PM-1 in a pure state, and then the second stable polymorph, PM-2:

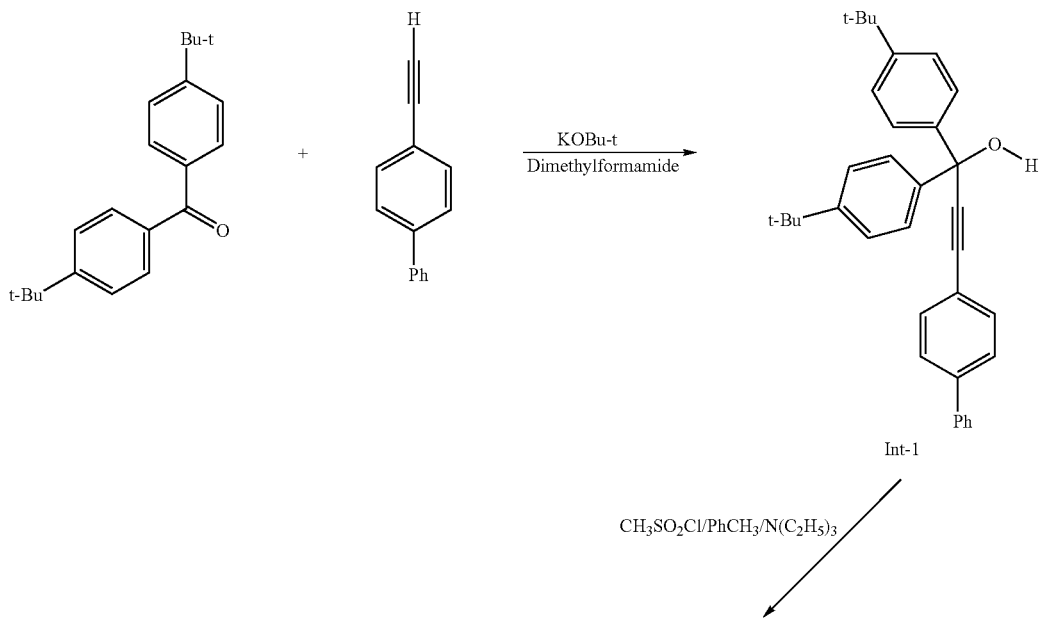

-continued

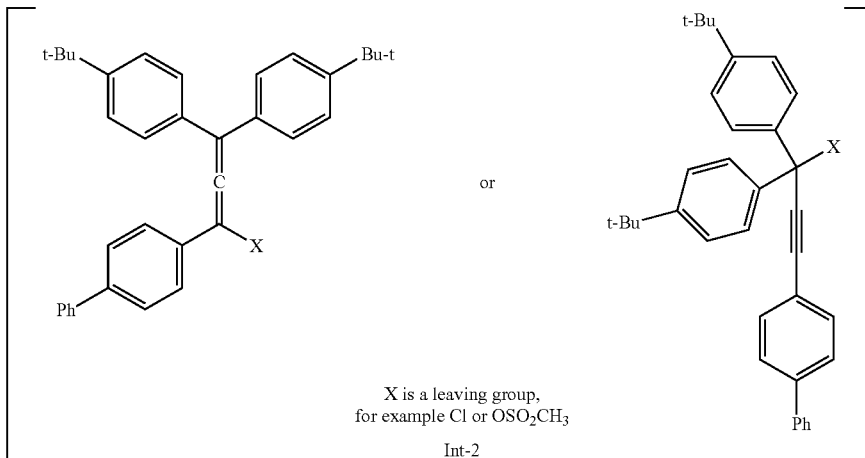

X is a leaving group,
for example Cl or OSO₂CH₃

Int-2

Heat- In the presence
or absence of a base
followed by sublimation

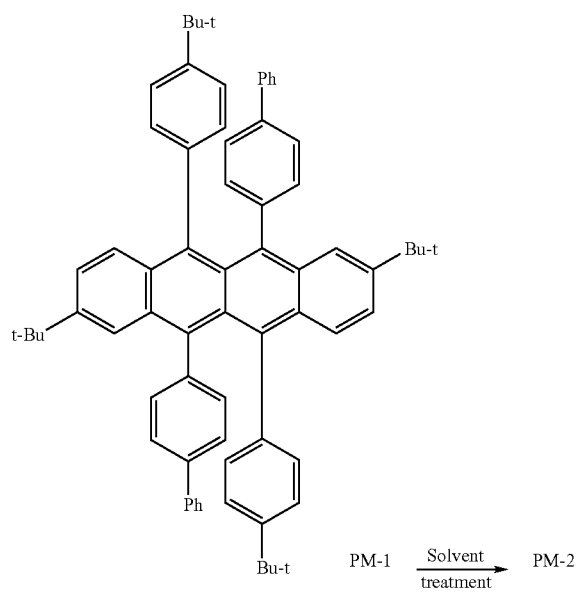

PM-1 →(Solvent treatment)→ PM-2

Preparation of the propargyl alcohol, Int-1: Under a nitrogen atmosphere, 4-biphenylacetylene (32.76 g of 97%, 178.3 lmMole), was dissolved in dimethylformamide (DMF) (750mL), stirred with a mechanical stirrer and the solution cool to −10° C. to 0° C. Powdered potassium t-butoxide (KBu$^t$O) (25 g of 95%, 213.97 mMole), was added over a 10-minute period and the mixture stirred well for approximately 15 minutes at −10+ C. to 0° C. To this mixture was then added 4,4'-di-tert-butylbenzophenone (50 g, 169.81 mMole) all at once. Stirring was continued at −10° C. to 0° C. for approximately 1 hour and then allowed to come to room temperature over a 1-hour period. At the end of this time the solution was cooled to 0° C. and the reaction treated with saturated sodium chloride (100 mL), keeping the temperature below 10° C. The mixture was then diluted with ethyl acetate, washed with 2N-HCl (3×100 mL), dried over MgSO₄, treated with decolorizing charcoal (×2), filtered and concentrated under reduced pressure. The crude product was triturated with ether (200 mL) and heptane (500 mL) to give the product as an off-white solid. Yield of propagyl alcohol Int-1, 72 g.

Preparation of Naphthacene Compound, PM-1: Propargyl alcohol Int-1, (5.0 g, 10 mMole) was dissolved in toluene (70 mL), with slight heating to get complete dissolution, cooled and stirred at 0° C. under a nitrogen atmosphere. To this solution was added triethylamine (NEt₃), (1.41 g, 1.81 mL, 14 mMole) and then treated drop-by-drop with methanesulfonyl chloride (CH₃SO₂Cl), (1.79 g, 1.21 mL 14 mMole), keeping the temperature of the reaction below 10° C. After the addition, the solution was stirred at 0° C. for 15 minutes and then at room temperature for 15 minutes. This completes the formation of Int-2. To the reaction mixture was then added finely powered anhydrous $Na_2CO_3$ (2.11 g, 20 mMole) and then heated, with good stirring, to 110° C. for 4 hours. After this period, the reaction was cooled, diluted with ethyl acetate (100 mL) and carefully washed with 2N—HCl until acidic. On standing, the product crystallized out. It was filtered off, washed well with methanol and dried. Yield 6.0 g. This material was then sublimed at $10^{-2}$ mm Hg at 330° C. to give the relatively unstable polymorph, PM-1.

Preparation of Naphthacene Compound, PM-2: The naphthacene compound PM-1 (1 g) was suspended in ethyl acetate (20 mL) and stirred well for 30 minutes at 20° C. under an inert atmosphere of nitrogen with the exclusion of all light from the reaction flask. At the end of this period polymorph PM-2 was filtered off, yield (1 g). To remove all solvent from PM-2, it was dried under vacuum at 200° C.

Samples 1 and 2:

To test the polymorphs for photo-oxidation, they were irradiated with a 150-watt tungsten bulb set at a distance of 12 inches from the solid sample. By subjecting the polymorphs to these accelerated conditions, the effects of long-term exposure to the normal conditions of exposure to light and atmospheric oxygen can be accessed rapidly. After the prescribed time shown in the table, a sample of each of polymorphs PM-1 and PM-2 was dissolved in tetrahydrofuran in the dark and kept in a light tight vial while analyzed by HPLC. The purity of the samples, expressed in area percent for the amount of polymorph remaining, was recorded. Sample 1 is polymorph PM-1, the first polymorph corresponding to that which would be formed upon sublimation, and which is relatively unstable to photo-oxidation. Sample 2 is polymorph PM-2, the second polymorph corresponding to that which would be formed upon treating PM-1 with solvent, and which is relatively stable to photo-oxidation.

TABLE

| Sample | Polymorph | Density g/mL | % Polymorph Remaining After Photo-oxidation Period (hrs) | | | |
|---|---|---|---|---|---|---|
| | | | 0 | 24 | 48 | 72 |
| 1 | PM-1 | 1.080 | 99.8 | 95.9 | 91.9 | 87.9 |
| 2 | PM-2 | 1.134 | 99.7 | 99.5 | 99.4 | 99.1 |

From the table it can be seen that Sample 1 containing polymorph PM-1, has lost a significant percentage of PM-1 to photo-oxidation after 24, 48 and 72 hours, indicating that PM-1 is relatively unstable to photo-oxidation. The loss of PM-1 to photo-oxidation corresponds to 12% over a 72-hour period. It can also be seen that Sample 2 containing polymorph PM-2, shows no appreciable loss of PM-2 after 24, 48 and 72 hours, thus indicating that PM-2 is the more stable polymorph to photo-oxidation. PM-2 has lost less than 1% to photo-oxidation over the same 72-hour period. In addition, the density of PM-2 is higher than that of PM-1.

Embodiments of the invention provide a process to significantly reduce the propensity of polycyclic aromatic compounds to undergo photo-oxidation. Such a process provides for polycyclic aromatic compounds to be more robust in their exposure to light and oxygen under storage conditions, significantly reducing the formation of endoperoxides and thus leading to EL devices that give satisfactory performance.

The invention has been described in detail with particular reference to certain preferred embodiments thereof, but it will be understood that variations and modifications can be effected within the spirit and scope of the invention.

The patents and other publications referred to are incorporated herein in their entirety.

The invention claimed is:

1. A process for improving the stability to photo-oxidation of a polycyclic aromatic compound formed upon sublimation where the compound exists in at least two polymorphic forms where the first is formed upon sublimation and is relatively unstable to photo-oxidation compared to the second, comprising treating the first polymorph with one or more solvents to obtain the more stable second polymorph of the polycyclic aromatic compound and then separating the second polymorph from the solvent.

2. A process of claim 1 wherein the polycyclic aromatic compound is a naphthacene.

3. A process of claim 1 wherein treating the first polymorph with one or more solvents is a homogeneous process.

4. A process of claim 1 wherein treating the first polymorph with one or more solvents is a heterogeneous process.

5. A process of claim 1 wherein the first polymorph is treated with a single solvent.

6. A process of claim 1 wherein the first polymorph is treated with a mixture of two or more solvents.

7. A process of claim 2 wherein treating the first polymorph with one or more solvents is a homogeneous process.

8. A process of claim 2 wherein treating the first polymorph with one or more solvents is a heterogeneous process.

9. A process of claim 2 wherein the first polymorph is treated with a singe solvent.

10. A process of claim 2 wherein the first polymorph is treated with a mixture of two or more solvents.

11. A process of claim 1 wherein the first polymorph is treated with a solvent in the temperature range for which the solvent exists in the liquid phase.

12. A process of claim 1 wherein the first polymorph is treated with a solvent in the temperature range from 0° C. to the boiling point of the solvent.

13. A process of claim 1 wherein the first polymorph is treated with a solvent in the temperature range from 20° C. to 50° C.

14. A process of claim 2 wherein the first polymorph is treated with a solvent in the temperature range for which the solvent exists in the liquid phase.

15. A process of claim 2 wherein the first polymorph is treated with a solvent in the temperature range from 0° C. to the boiling point of the solvent.

16. A process of claim 1 wherein the solvent is selected from alcohol, amine, amide, carboxylic acid, ether, ester, hydrocarbon, ketone, sulfone, sulfoxide, sulfide, disulfide, and nitrile group containing solvents.

17. A process of claim 16 wherein said solvents contain from 1 to 12 carbon atoms.

18. A process of claim 16 wherein the solvent is selected from mono-ethers and polyethers.

19. A process of claim 16 wherein the solvent is a hydrocarbon selected from aliphatic, aromatic, hetero-aromatic, halogenated and nitro group containing hydrocarbons.

20. A process of claim 19 wherein the halogenated hydrocarbon is selected from fluoro, chloro, bromo and iodo containing hydrocarbons.

21. A process of claim 16 wherein the solvent comprises one selected from acetic acid, acetone, acetonitrile, aminoethane, benzene, bromoethane, bromoethylene, n-butanol, i-butanol, t-butanol, carbon disulfide, carbon tetrachloride, chlorobenzene, chioroethane, chloroethylene, chloroform, cyclohexane, cyclohexanol, 1,2-dibromoethane, dibromomethane, o-dichlorobenzene, 1,1-dichioroethane, 1,2-dichloroethane, dichioromethane, 1,2-diethoxyethane, diethylamine, diethylene glycol, diethyleneglycol diethyl ether, diethylene glycol dimethyl ether (diglyme), diethyl ether, diiodoethane, 1,1-dimethoxyethane, 1,2-dimethoxyethane, N,N-dimethylacetaxnide, 2,2-dimethylbutane, 2,3-dimethylbutane, N,N-dimethylforaniide, N,N-dimethylpropionamide, dimethylsulfoxide, 1,2-diiodoethane, 1,4-dioxane, ethanol, ethanolamine, ethyl acetate, ethylantue, ethylbenezene, ethylene glycol, ethylene glycol dimethyl ether (glyme), ethyl formate, ethyl methyl ketone, formamide, formic acid, heptane, hexane, isooctane, mesitylene, methanol, methyl acetate, nitrobenzene, nitromethane, octane, pentane, i-propanol, n-propanol, propionitrile, pyridine, sulfolane, 1,1,2,2-tetracbloroethane, tetrachloroethylene, tetrahydrofuran, toluene, triethylamine, triethylene glycol dimethyl ether (triglyme), 2,2,2-trifluoroethanol, water, o-xylene, m-xylene and p-xylene.

22. A process of claim 21 wherein the solvent comprises one selected from acetic acetone, acetonitrile, benzene, n-butanol, i-butanol, t-butanol, carbon disulfide, carbon tetrachloride, chloroform, cyclohexane, dichloromethane, diethyl ether, N,N-dimethylforamide, dimethylsulfoxide, 1,4-dioxane, ethanol, ethyl acetate, ethyl methyl ketone, heptane, hexane, methanol, i-propanol, n-propanol, tetrahydrofuran, toluene, water, o-xylene, m-xylene and p-xylene.

23. A process of claim 2 wherein the naphthacene compound is represented by formula (I):

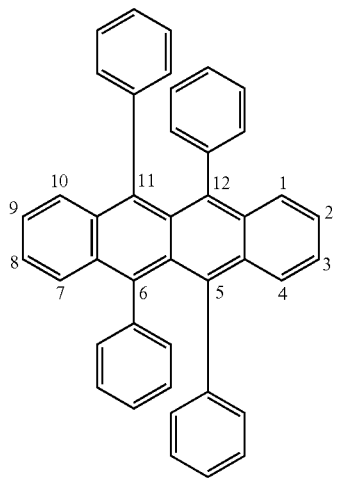

Formula (I)

wherein:
a) any hydrogen can be substituted;
b) there are identical substituent groups at the 2, 3, 8 and 9-positions; and
c) provided that no more than 4 substituents are tertiary butyl groups.

24. A process of claim 2 wherein the naphthacene compound is represented by formula (I):

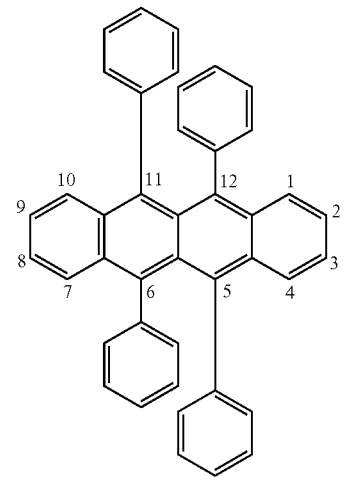

Formula (I)

wherein:
a) there are identical substituent groups at the 2- and 8-positions;
b) the phenyl rings in the 5- and 11-positions contain only parasubstituents identical to the substituent groups in paragraph a); and
c) provided that when the substituent groups are tertiary butyl groups, there are no more than 4 of said groups present.

25. A process of claim 24 wherein:
a) there are identical alkyl or carbocyclic groups at the 2- and 8-positions;
b) the phenyl rings in the 5- and 11-positions contain only parasubstituents identical to the alkyl or carbocyclic groups in paragraph a); and
c) provided that there are no more than 4 tertiary butyl groups present.

26. A process of claim 25 wherein:
a) there are identical branched alkyl or non-aromatic carbocyclic groups at the 2- and 8-positions;
b) the phenyl rings in the 5- and 11-positions contain only parasubstituents identical to the alkyl or carbocyclic groups in paragraph a); and
c) provided that there are no more than 4 tertiary butyl groups present.

27. A process of claim 23 wherein the phenyl rings in the 6- and 12-positions are substituted.

28. A process of claim 24 wherein the phenyl rings in the 6- and 12-positions are substituted.

29. A process of claim 25 wherein the phenyl rings in the 6- and 12-positions are substituted.

30. A process of claim 26 wherein the phenyl rings in the 6- and 12-positions are substituted.

31. A process of claim 1 wherein the more stable polymorph is separated from the solvent by filtration.

32. A process of claim 31 wherein the separated more stable polymorph is heated under vacuum to remove residual solvent.

33. A process of claim 1 wherein the more stable polymorph after separation from the solvent is heated a second time with a solvent.

34. A process of claim 33 wherein the more stable polymorph after separation from the solvent, is heated additional times with a solvent.

35. A process of claim 31 wherein the more stable polymorph after separation from the solvent is heated a second time with a mixture of two or more solvents.

36. A process for improving the stability to photo-oxidation of a polycyclic aromatic compound where the compound exists in at least two polymorphic forms where the first polymorph, corresponding to that which would be formed upon sublimation, has a larger molecular interlayer distance compared to the second form, comprising heating the first polymorph with one or more solvents to obtain the more stable second polymorph of the polycyclic aromatic compound and then separating the second polymorph from the solvent.

37. A process of claim 36 wherein the polycyclic aromatic compound is a naphthacene compound.

38. A process for improving the stability to photo-oxidation of a polycyclic aromatic compound where the compound exists in at least two polymorphic forms where the first polymorph, corresponding to that which would be formed upon sublimation, has an interlayer distance of 7.1 angstroms or more, comprising treating the first polymorph with one or more solvents to obtain a second polymorph of the polycyclic aromatic compound with an interlayer distance of 7 angstroms or less, and then separating the second polymorph from the solvent.

39. A process of claim 38 wherein the polycyclic aromatic compound is a naphthacene compound.

40. A process for improving the stability to photo-oxidation of a polycyclic aromatic compound where the compound exists in at least two polymorphic forms where the first polymorph, corresponding to that which would be formed upon sublimation, has a lower density compared to the second form, comprising treating the first polymorph with one or more solvents to obtain a second polymorph of the polycyclic aromatic compound, and then separating the second polymorph from the solvent.

41. A process of claim 40 wherein the polycyclic aromatic compound is a naphthacene compound.

42. A process for making an OLED device comprising subliming the stable polymorph of claim 1 onto a suitable substrate as part of a luminescent layer.

43. A process for making an OLED device comprising subliming the stable polymorph of claim 1 onto a suitable substrate as part of a non-luminescent layer.

44. A process of claim 1 wherein treating the first polymorph comprises slurrying said polymorph with one or more solvents.

45. A process of claim 2 wherein the naphthacene compound is represented by formula (II):

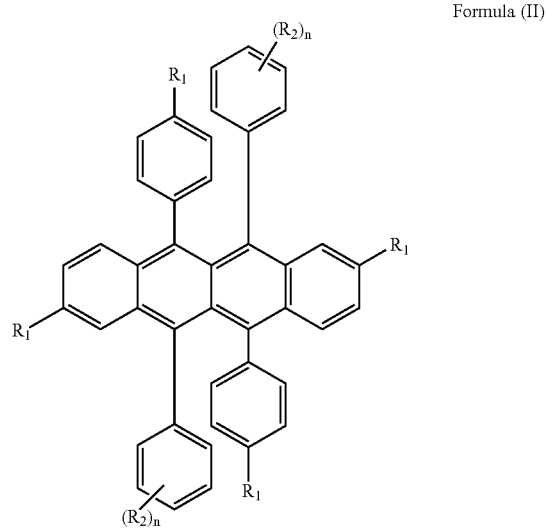

wherein
$R_1$ is represented by the formula;

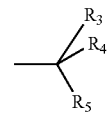

wherein each of $R_3$, $R_4$ and $R_5$ is hydrogen or an independently selected substituent or $R_3$, $R_4$ and $R_5$ taken together can form a mono- or multi-cyclic ring system;
$R_2$ is a substituent group;
n is 1-5;
provided that all $R_1$ groups are the same; and
provided further, that the $R_2$ groups, their location and n value on one ring are the same as those on the second ring; and
provided still further, that no more than 4 substitutents are tertiary butyl groups.

46. A process of claim 1 wherein the polycyclic aromatic compound is a polycyclic aromatic hydrocarbon.

47. A process of claim 1 wherein the polycyclic aromatic compound is a heteroatomic polycyclic aromatic hydrocarbon.

48. A process of claim 1 wherein the polycyclic aromatic compound is selected from anthracene, azulene, biphenylene, fluorene, hexacene, s-indacene, indene, naphthalene, naphthacene, octalene, pentacene, pentalene, and derivatives thereof formed by the fusion of other rings.

49. A process of claim 1 wherein the polycyclic aromatic hydrocarbon is selected from aceanthrylene, acenaphthalene, acephenanthrylene, 3,4-benzopyrene, chrysene, coronene, fluoranthene, hexahelicene, as-indacene, ovalene, pentahelicene, pentaphene, perylene, phenanthrene, phenalene, picene, pleiadene, pyranthrene, pyrene, rubicene, tetraphenylene, triphenylene, and derivatives thereof formed by the fusion of other rings.

* * * * *

UNITED STATES PATENT AND TRADEMARK OFFICE
CERTIFICATE OF CORRECTION

PATENT NO. : 7,371,906 B2 Page 1 of 1
APPLICATION NO. : 10/924637
DATED : May 13, 2008
INVENTOR(S) : William J. Begley et al.

It is certified that error appears in the above-identified patent and that said Letters Patent is hereby corrected as shown below:

| | |
|---|---|
| Column 14, line 32 | In Claim 9, delete "singe" and insert -- single --, therefor. |
| Column 15, line 2 | In Claim 21, delete "chioroethane," and insert -- chloroethane, --, therefor. |
| Column 15, line 4 | In Claim 21, delete "1,1-dichioroethane," and insert -- 1,1-dichloroethane, --, therefor. |
| Column 15, line 5 | In Claim 21, delete "dichioromethane," and insert -- dichloromethane, --, therefor. |
| Column 15, line 10 | In Claim 21, delete "N,N-dimethylacetaxnide," and insert -- N,N-dimethylacetamide, --, therefor. |
| Column 15, line 11 | In Claim 21, delete "N,N-dimethylforaniide," and insert -- N,N-dimethylformamide, --, therefor. |
| Column 15, line 13 | In Claim 21, delete "ethylantue," and insert -- ethylamine, --, therefor. |
| Column 15, line 14 | In Claim 21, delete "ethylbenezene," and insert -- ethylbenzene, --, therefor. |
| Column 15, line 20 | In Claim 21, delete "1,1,2,2-tetracbloroethane," and insert -- 1,1,2,2-tetrachloroethane, --, therefor. |
| Column 15, line 29 | In Claim 22, delete "N,N-dimethylforamide," and insert -- N,N-dimethylformamide, --, therefor. |
| Column 16, line 28 | In Claim 24, delete "parasubstituents" and insert -- para-substituents --, therefor. |
| Column 16, line 38 | In Claim 25, delete "parasubstituents" and insert -- para-substituents --, therefor. |
| Column 16, line 46 (Approx.) | In Claim 26, delete "parasubstituents" and insert -- para-substituents --, therefor. |
| Column 16, line 66 | In Claim 33, delete "heated" and insert -- treated --, therefor. |
| Column 17, line 3 | In Claim 34, delete "heated" and insert -- treated --, therefor. |
| Column 17, line 6 | In Claim 35, delete "heated" and insert -- treated --, therefor. |
| Column 17, line 15 | In Claim 36, delete "heated" and insert -- treated --, therefor. |

Signed and Sealed this

Nineteenth Day of January, 2010

David J. Kappos
*Director of the United States Patent and Trademark Office*